(12) United States Patent
Verma

(10) Patent No.: US 12,146,935 B2
(45) Date of Patent: Nov. 19, 2024

(54) FAST RF POWER MEASUREMENT APPARATUS FOR PRODUCTION TESTING

(71) Applicant: Silicon Laboratories Inc., Austin, TX (US)

(72) Inventor: Anant Verma, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 210 days.

(21) Appl. No.: 17/893,635

(22) Filed: Aug. 23, 2022

(65) Prior Publication Data

US 2024/0069140 A1 Feb. 29, 2024

(51) Int. Cl.
G01R 35/00 (2006.01)
G01R 21/06 (2006.01)
G01R 31/26 (2020.01)

(52) U.S. Cl.
CPC .......... *G01R 35/005* (2013.01); *G01R 21/06* (2013.01); *G01R 31/2601* (2013.01)

(58) Field of Classification Search
CPC .. G01R 35/005; G01R 21/06; G01R 31/2601; G01R 31/2841; G01R 27/28; G01R 31/2822; G01R 31/2879; G01R 31/2886; G01R 31/2889; G01R 31/28; G01R 31/26
USPC .................................................. 324/756.02
See application file for complete search history.

(56) References Cited

U.S. PATENT DOCUMENTS

| | | | | |
|---|---|---|---|---|
| 5,241,277 | A * | 8/1993 | Kefalas | G01R 31/69 324/538 |
| 6,397,160 | B1 * | 5/2002 | Craig | G01R 31/3167 702/120 |
| 6,794,861 | B2 * | 9/2004 | Maassen | G01R 35/005 324/750.02 |
| 7,009,382 | B1 * | 3/2006 | Hickling | G01R 31/3191 324/750.02 |
| 2006/0224343 | A1 * | 10/2006 | Visser | G01R 31/2822 702/85 |
| 2011/0301905 | A1 * | 12/2011 | Gregg | H04W 24/00 702/106 |
| 2012/0052816 | A1 * | 3/2012 | Chang | H04W 24/06 455/67.12 |
| 2013/0187674 | A1 * | 7/2013 | Rada | H04B 17/21 324/750.02 |
| 2014/0122009 | A1 * | 5/2014 | Meiyappan | H04B 17/0085 702/85 |
| 2022/0094453 | A1 * | 3/2022 | Ramian | H04B 17/309 |

* cited by examiner

*Primary Examiner* — Tung X Nguyen
*Assistant Examiner* — Robert P Alejnikov, Jr.
(74) *Attorney, Agent, or Firm* — Nields, Lemack & Frame, LLC (57) ABSTRACT

A system and method for performing production testing on high power semiconductor devices is disclosed. The system includes signal generators, RF meters, sockets, couplers and connectors which also function as switches when connected to an external cable. A calibration process is executed which allows the controller to create a correlation between measurements taken by the RF meter and the actual voltages, and power levels present at the device under test. By performing this calibration, it is possible to perform production testing of devices much more quickly and reliably.

12 Claims, 8 Drawing Sheets

FAST RF POWER MEASUREMENT APPARATUS FOR PRODUCTION TESTING

FIELD

This disclosure describes systems and methods for performing RF power measurements during production testing.

BACKGROUND

Semiconductor devices are becoming capable of receiving and generating large amounts of power. When used commercially, these devices may be soldered and attached to one or more heat sinks or heat mitigating devices. However, during production testing, the device is simply placed in a test socket, which typically does not provide the same amount of cooling as is present in the commercial systems. Consequently, during device testing, these devices may self-heat to levels that are not acceptable.

One approach to mitigate this issue is to perform the device testing as quickly as possible, so that the device under test is only receiving or generating high power signals for a very limited amount of time. However, traditional test methods and system require the device under test to be subject to these high power signals for extended periods of time Therefore, it would be beneficial if there were a system and method that enabled production testing of semiconductor devices that received and generated high power signals without allowing these devices to overheat during the testing process.

SUMMARY

A system and method for performing production testing on high power semiconductor devices is disclosed. The system includes signal generators, RF meters, sockets, couplers and connectors which also function as switches when connected to an external cable. A calibration process is executed which allows the controller to create a correlation between measurements taken by the RF meter and the actual voltages and power levels present at the device under test. By performing this calibration, it is possible to perform production testing of devices much more quickly and reliably.

According to one embodiment, a method of testing a semiconductor device using a production test system, wherein the production test system includes a socket to hold the semiconductor device, a signal generator and a RF meter, is disclosed. The method comprises inserting a monitoring device in a connector, the connector in electrical communication with an interface on the socket for holding the semiconductor device; calibrating the RF meter and the monitoring device; removing the monitoring device; using the signal generator to create a signal wherein the signal is received at the semiconductor device and at the RF meter; and determining parameters of the signal as received by the semiconductor device based on measurements from the RF meter and correlation information determined during the calibrating. In some embodiments, calibrating the RF meter and the monitoring device comprises: supplying a test signal with a known set of parameters from the signal generator, wherein the test signal is received by the RF meter and the monitoring device; recording a measurement of the test signal from the RF meter and the monitoring device; repeating the supplying and recording for a plurality of parameters to create calibration data; and using the calibration data to create a correlation between the measurement from the RF meter and the measurement from the monitoring device. In some embodiments, the correlation comprises a polynomial equation. In some embodiments, the correlation comprises a look up table. In some embodiments, the parameters comprise frequency and power level; and the repeating the supplying comprises setting the signal generator at a first frequency and using the signal generator to output the test signal using the first frequency and a plurality of different power levels; and changing the frequency to a second frequency and using the signal generator to output the test signal using the second frequency and the plurality of different power levels. In some embodiments, the parameters comprise frequency and power level.

According to another embodiment, a method of testing a semiconductor device using a production test system, wherein the production test system includes a socket to hold the semiconductor device, a signal generator and a RF meter, is disclosed. The method comprises inserting the signal generator in a connector, the connector in electrical communication with an interface on the socket for holding the semiconductor device; calibrating the RF meter and the signal generator; removing the signal generator; receiving a signal output by the semiconductor device at the RF meter; and determining parameters of the signal output by the semiconductor device based on measurements from the RF meter and correlation information determined during the calibrating. In some embodiments, calibrating the RF meter and the signal generator comprises: supplying a test signal with a known set of parameters from the signal generator; recording a measurement of the test signal from the RF meter; repeating the supplying and recording for a plurality of parameters to create calibration data; and using the calibration data to create a correlation between the measurement from the RF meter and an output from the signal generator. In some embodiments, the correlation comprises a polynomial equation. In some embodiments, the correlation comprises a look up table. In some embodiments, the parameters comprise frequency and power level; and the repeating the supplying comprises setting the signal generator at a first frequency and using the signal generator to output the test signal using the first frequency and a plurality of different power levels; and changing the frequency to a second frequency and using the signal generator to output the test signal using the second frequency and the plurality of different power levels. In some embodiments, the parameters comprise frequency and power level.

According to another embodiment, a production test system is disclosed. The production test system comprises a signal generator; a RF meter; a socket to hold a device under test; a controller, in communication with the signal generator and the RF meter; and a printed circuit board comprising a coupler having an input and a first output and a second output; and a connector, wherein the connector has a first state wherein a first lead of the connector is in electrical communication with a second lead of the connector; and a second mode where a cable is attached to the connector and the first lead is not in communication with the second lead, wherein the second lead is in electrical communication with an interface on the socket; wherein the signal generator is in electrical communication with the input to the coupler, the first output from the coupler is in electrical communication with the first lead of the connector, and the second first is in communication with the RF meter. In some embodiments, the printed circuit board comprises a switch, having a plurality of inputs and one output in communication with the RF meter, wherein the second output of the coupler is one of the plurality of inputs, and wherein the controller controls the switch to select one of the plurality of inputs to be in electrical communication with the RF meter. In some embodiments, in calibration mode, a monitoring device is inserted in the connector, the controller is in communication with the monitoring device, and the controller: sets the signal generator at a first frequency and uses the signal generator to output a test signal using the first frequency and a plurality of different power levels; records the test signal at the monitoring device and at the RF meter; and correlates measurements at the monitoring device with measurements at the RF meter at the plurality of different power levels to create a correlation. In some embodiments, the correlation comprises a polynomial equation. In some embodiments, the correlation comprises a look up table. In some embodiments, during test mode, the controller uses the signal generator to create a signal wherein the signal is received at a semiconductor device disposed in the socket and at the RF meter; and determines a power level of the signal as received by the semiconductor device based on measurements from the RF meter and the correlation determined during the calibration mode.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1A:
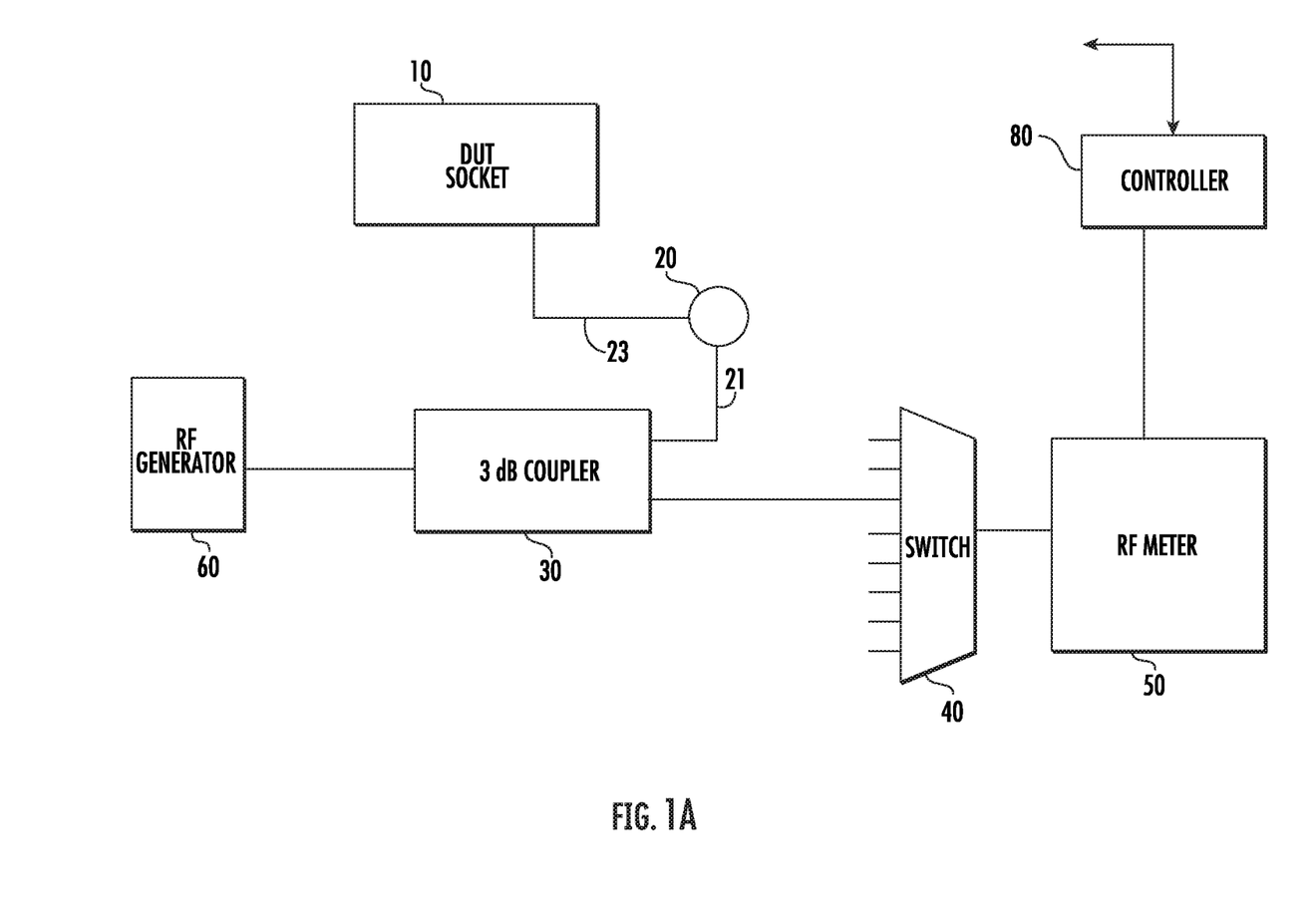
FIG. 1A is a block diagram of a production test system according to one configuration.

FIG. 1A shows a block diagram of a production test system according to one configuration. The production test system may comprise a printed circuit board on which the device under test (DUT) is disposed. The printed circuit board also comprises other components, as described herein. In this embodiment, the device under test is configured to receive an input from a signal generator. In other words, at least one of the connections on the device under test is intended to receive an input. The production test system may include a socket 10 to hold the device under test. The interfaces of the socket 10 are each in communication with a respective connection on the device under test. One or more interfaces of the socket 10 are each in communication with a respective connector 20. The connector 20 may be disposed very close to the location of the socket 10, such as less than 1 inch away. In one embodiment, the connector 20 is disposed beneath the socket 10, which is not present during the calibration process. In this embodiment, the socket is installed only for the actual production testing. In all embodiments, the connector 20 is disposed proximate to the connection where the signal enters the device under test. In some embodiments, the term "proximate" indicates a distance that may be less than 2 inches away. In other embodiments, the term "proximate" indicates a distance that may be less than 1 inch away. In yet other embodiments, the term "proximate" indicates a distance that may be less than 0.5 inches away. FIG. 1A shows only one connector 20, but any number of connectors 20 may be deployed in the production test system.

Figure 2A:
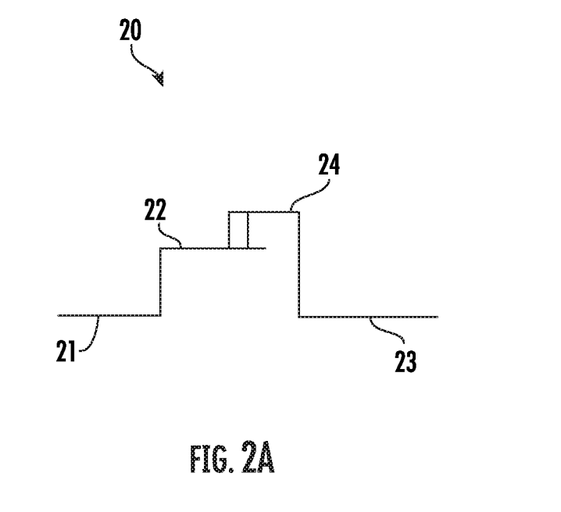
FIGS. 2A-2B shows the operation of the connector.
Figure 2B:
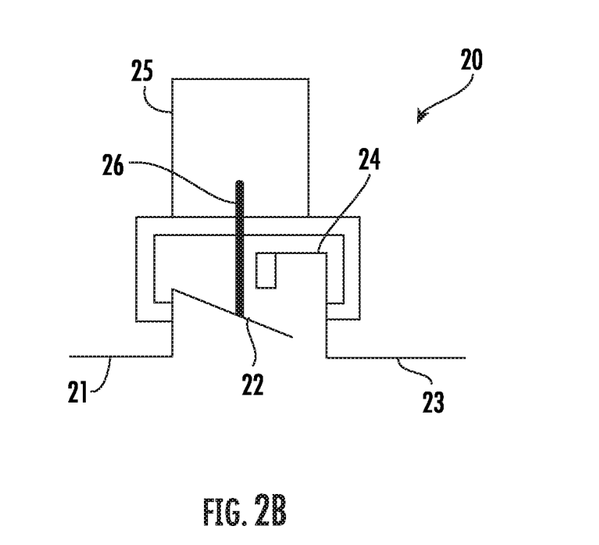

The connector 20 also functions as a switch. Commercially available examples of such switches exist, such as the MM8030 RF connector. FIG. 2A-2B show the operation of the connector 20 when a cable is not disposed in the connector 20 and when the cable is disposed in the connector 20, respectively.

As seen in FIG. 2A, the connector 20 includes two leads; a first lead 21 and a second lead 23. The first lead 21 is in communication with a deflectable segment 22. The second lead 23 is in communication with a connecting segment 24. When the cable is not inserted, the deflectable segment 22 is in contact with the connecting segment 24. Thus, the first lead 21 and the second lead 23 are electrically connected at this time.

FIG. 2B shows the connector 20 with a cable 25 inserted in the connector. Note that the cable has a prong 26 that extends into the connector 20, contacting the deflectable segment 22. This moves the deflectable segment so that the first lead 21 is no longer electrical connected to the second lead 23. However, the first lead 21 is electrically connected to the prong 26.

Thus, in a first state, when no cable is inserted, the first lead 21 is electrically connected to the second lead 23; and, in a second state, when a cable is inserted, the first lead 21 is no longer electrically connected to the second lead 23. In this way, there are no reflections from the second lead 23 during the calibration process, since the second lead 23 is not connected to the first lead 21.

Returning to FIG. 1A, the first lead 21 is electrically connected to a first output of a coupler 30. The coupler 30 may be a traditional two-way splitter, wherein each output is 50% of the power of the input. A two-way splitter may also be referred to as a 3 dB coupler.

The second output of the coupler 30 may be in electrical communication, either directly or indirectly with a RF meter 50. The RF meter 50 may be capable of measuring frequency, amplitude and phase of an incoming signal. In other embodiments, the RF meter may be configured to measure average power or RMS (root mean square) power. Further, these measurements may be correlated with time or time-stamped.

In certain embodiments, the RF meter 50 is used to measure a plurality of different signals. In these embodiments, a multiplexer or switch 40 may be used to select one of N inputs to pass to the RF meter 50. In these embodiments, the second output of the coupler 30 is electrically connected to one of the inputs of the switch 40.

The RF meter 50 may be in communication with a controller 80, which receives the measurements captured by the RF meter. The controller 80 has a processing unit and an associated memory device. The processing unit may be any suitable component, such as a microprocessor, embedded processor, an application specific circuit, a programmable circuit, a microcontroller, or another similar device. The memory device contains the instructions, which, when executed by the processing unit, enable the controller 80 to perform the functions described herein. This memory device may be a non-volatile memory, such as a FLASH ROM, an electrically erasable ROM or other suitable devices. In other embodiments, the memory device may be a volatile memory, such as a RAM or DRAM. The instructions contained within the memory device may be referred to as a software program, which is disposed on a non-transitory storage media.

The controller 80 may also be in communication with the switch so as to select the signal that passes through the switch 40 to the RF meter 50. Further, the controller 80 may also be in communication with other components used during the calibration process, as described below.

The production system may also utilize a signal generator 60, the output of which is provided to the input of the coupler 30. The printed circuit board may include a connection which is used to connect the signal generator 60 to the production test system. The signal generator 60 may be configured to supply a signal having a desired frequency and power to the coupler 30. The output of the signal generator 60 may be an RF power signal. In some embodiments, the frequency and power of the signal generated by the signal generator 60 may be determined by the controller 80. The controller 80 may be in communication with this signal generator 60 to select the frequency and power of the signal to be generated.

Thus, in normal test mode, which is shown in FIG. 1A, the signal generator 60 supplies a signal to the coupler 30. The coupler 30 splits the signal such that an attenuated version of that signal is transmitted to the socket 10 and to the RF meter 50. In this way, the RF meter 50 records information regarding the signal that was transmitted to the socket 10.

Figure 1B:
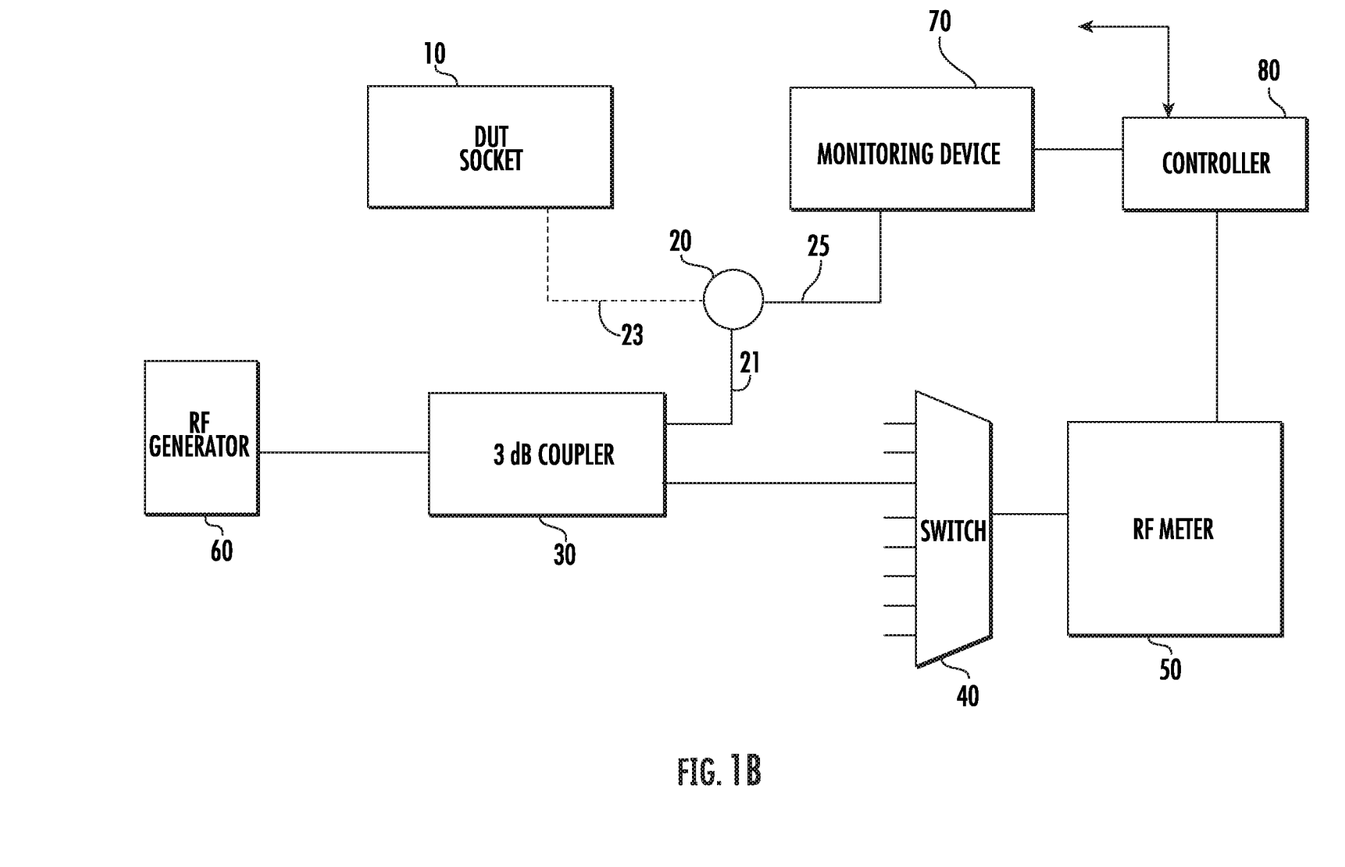
FIG. 1B is a block diagram of the production test system of FIG. 1A during the calibration process.

The production test system also has a calibration mode, which is shown in FIG. 1B. In this mode, a monitoring device 70, such as a spectrum analyzer, a RF meter or other similar device, is inserted into the connector 20. The controller 80 may be in communication with the monitoring device 70 as well. As explained above, the insertion of the monitoring device 70 into the connector 20 disables the connection from the first lead 21 to the second lead 23. Therefore, the signal from the coupler 30 does not reach the socket 10, rather that signal is supplied to the monitoring device 70. Thus, in calibration mode, which is shown in FIG. 1B, the signal generator 60 supplies a signal to the coupler 30, which transmits an attenuated version of that signal to the monitoring device 70 and to the RF meter 50. The amount of attenuation of the signal received by the monitoring device 70 is unknown. The attenuation changes based on the length of the trace from the signal generator 60 to the coupler 30, the length of the first lead 21, and the length of the cable 25. Thus, each production test system may experience a different amount of attenuation. Further, the signal that is received by the RF meter 50 is also attenuated. Again, the amount of attenuation is based on the length of the traces from the signal generator 60 to the coupler 30, from the coupler 30 to the switch 40 and from the switch 40 to the RF meter 50. Because of the calibration process described herein, the amount of attenuation is not important and does not need to be computed.

Figure 3A:
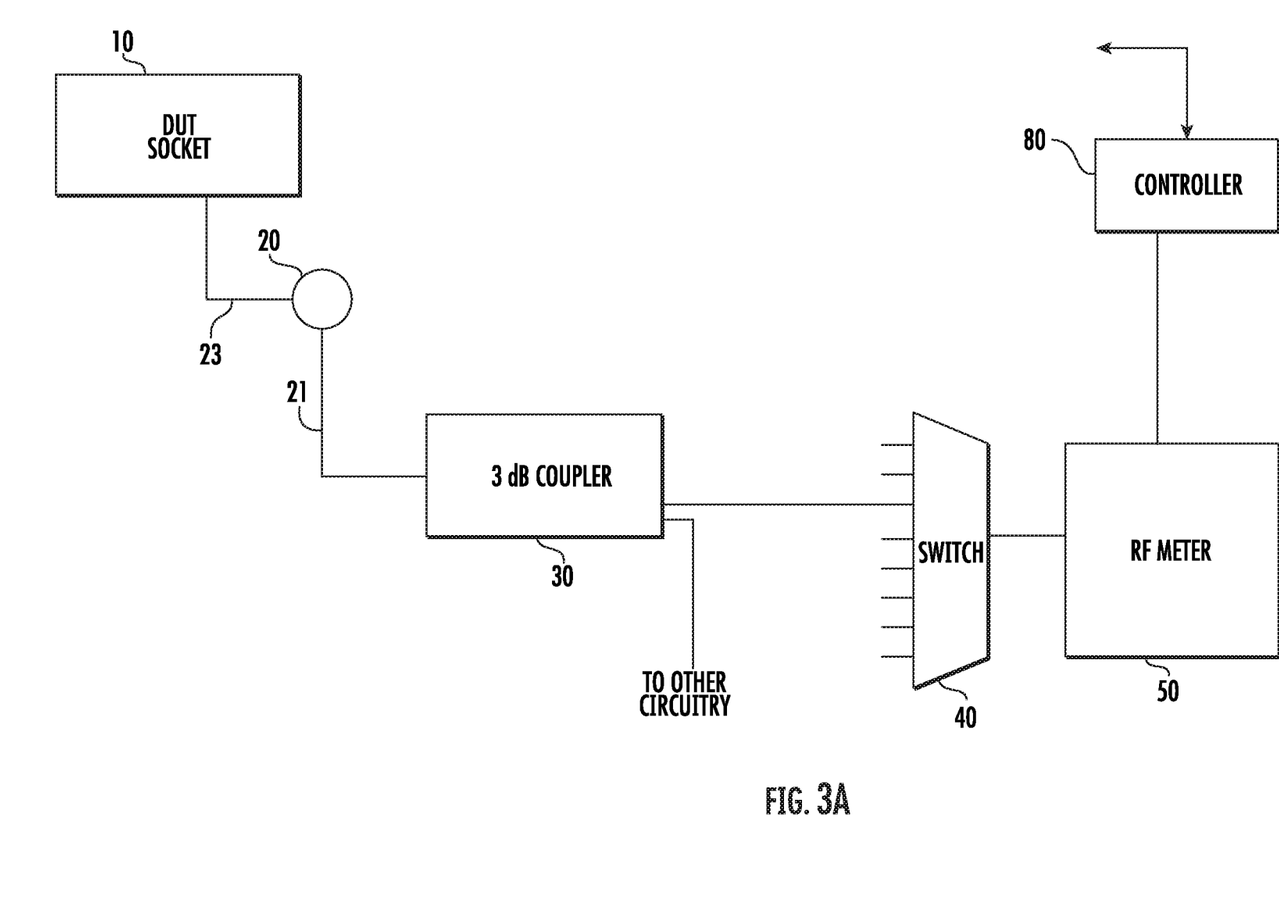
FIG. 3A is a block diagram of a production test system according to another configuration.

FIG. 3A shows a block diagram of a production test system according to another embodiment. In this embodiment, the device under test is configured to supply an output that must be measured. In other words, at least one of the connections on the device under test is intended to provide an output. The production test system may include a socket 10 to hold the device under test. The interfaces of the socket 10 are each in communication with a respective connection on the device under test. One or more interfaces of the socket 10 are each in communication with a respective connector 20. FIG. 3A shows only one connector 20, but any number of connectors 20 may be deployed in the production test system.

As described above, the connector 20 also functions as a switch. The first lead 21 of the connector 20 is in communication with the input to the coupler 30. One output of the coupler 30 is, directly or indirectly, in communication with the RF meter 50, as it was in FIGS. 1A-1B. The second output from the coupler 30 may be provided to some other circuit on the production test system. If there are no other functions, the coupler 30 may be omitted and the first lead 21 may connect directly or indirectly to the RF meter 50. As described above, in some embodiments, the RF meter 50 is used to monitor a plurality of signals, so a switch 40 is used to select which signal is supplied to the RF meter 50.

Figure 3B:
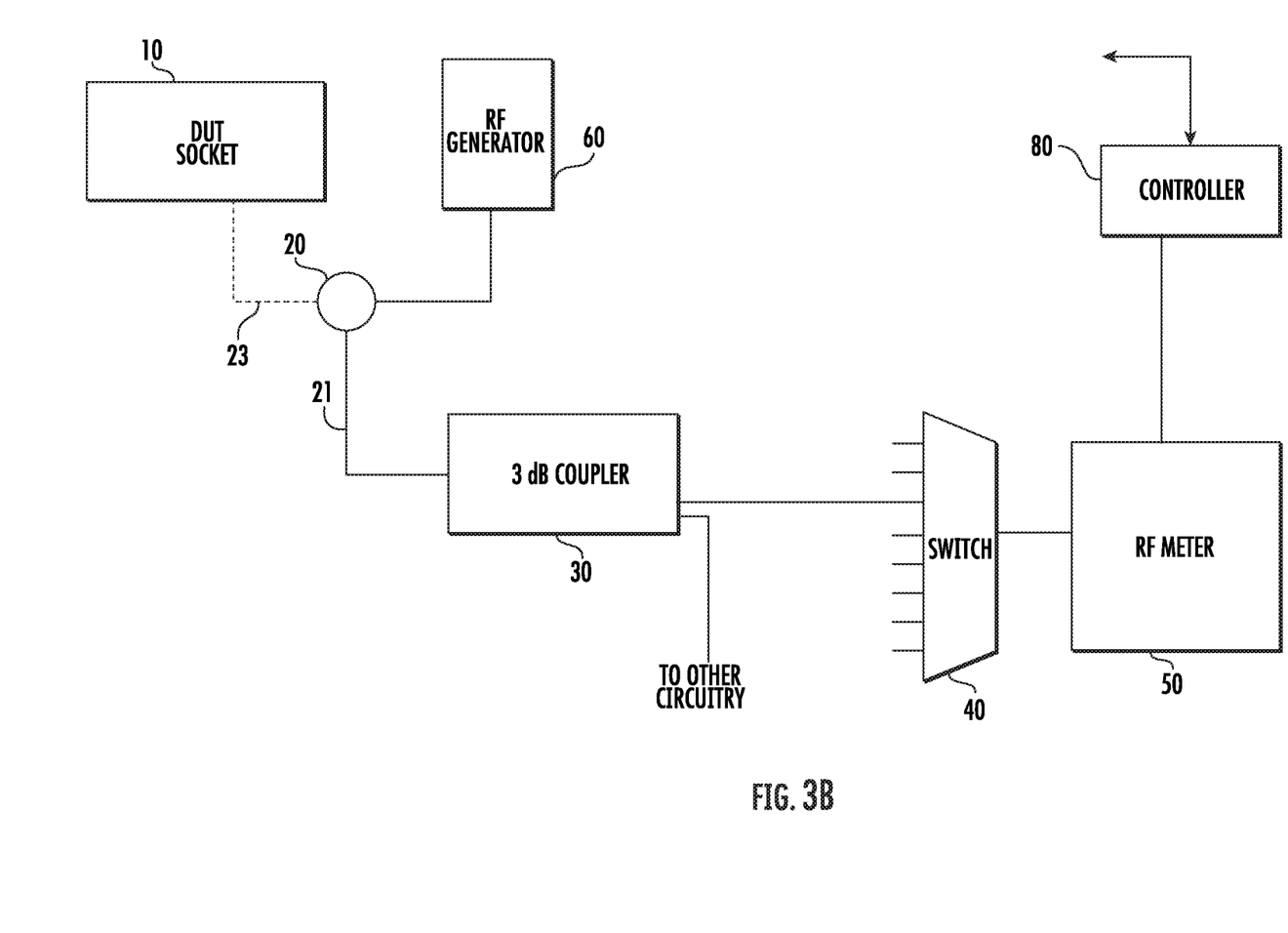
FIG. 3B is a block diagram of the production test system of FIG. 3A during the calibration process.

The production test system also has a calibration mode, which is shown in FIG. 3B. In this mode, a signal generator 60 is inserted into the connector 20. As explained above, this insertion disables the connection from the first lead 21 to the second lead 23. Therefore, the signal from the signal generator 60 does not reach the socket 10, rather that signal is supplied to the coupler 30. Thus, in calibration mode, the signal generator 60 supplies a signal to the coupler 30, which transmits that signal to the RF meter 50 and optionally to other circuitry.

Having described the system configurations, the calibration mode will be described in more detail.

Figure 4:
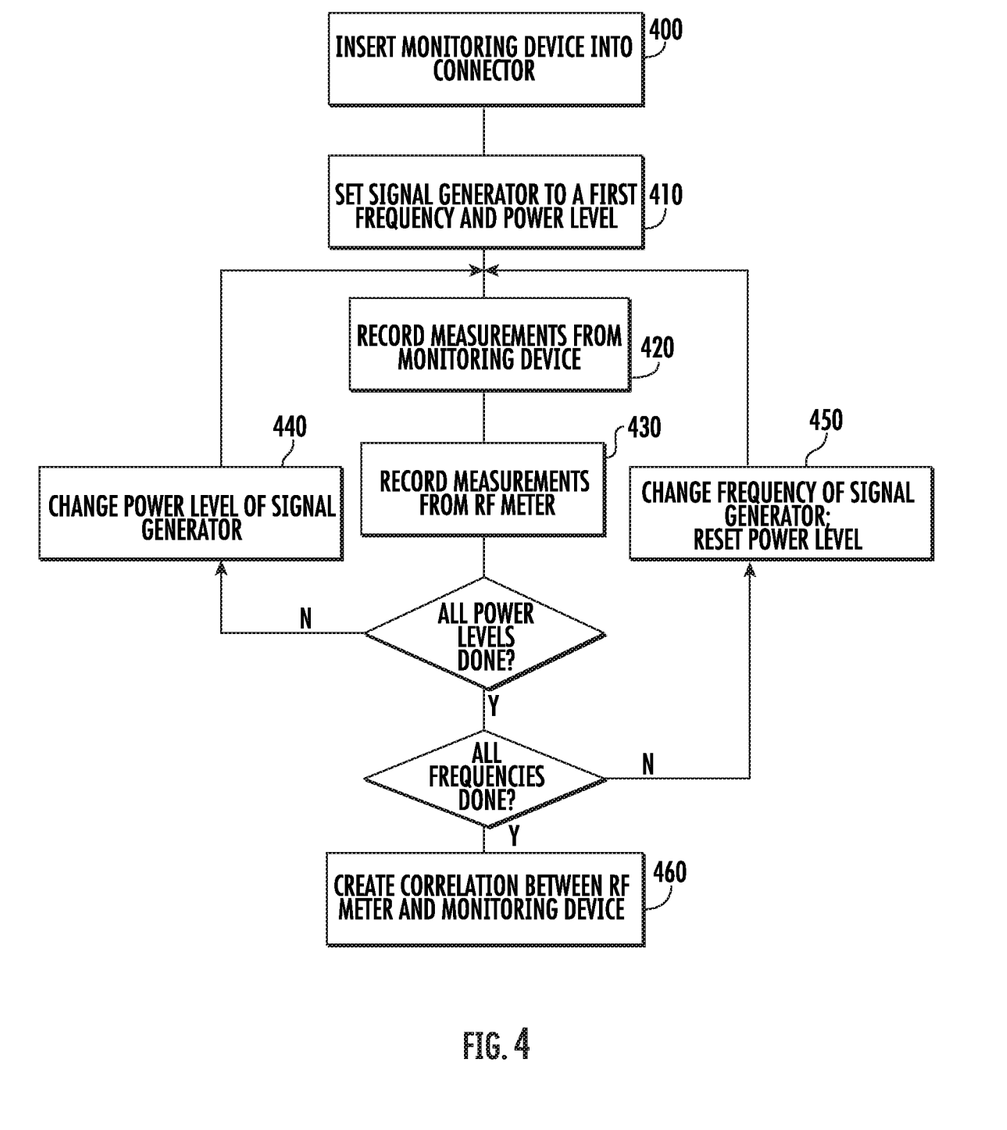
FIG. 4 shows the operation of the controller for the configuration shown in FIG. 1B.

FIG. 4 shows a flowchart that may be executed by the controller 80 to calibrate the production test system of FIG. 1A, where the device under test is to receive an input at one of its terminals. First, as shown in Box 400, the monitoring device 70 is installed in the connector 20. As explained above, this physically disconnects the device under test from the first lead 21. Next, as shown in Box 410, the signal generator 60 is set to a first set of parameters. In one embodiment, the set of parameters includes frequency and power level. In some embodiments, different parameters may be used, such as frequency and amplitude. Next, as shown in Box 420, the signal received at the monitoring device 70 is recorded and stored. Likewise, as shown in Box 430, the signal received at the RF meter 50 is also recorded and stored. The controller 80 associates these two measurements with the same set of parameters used by the signal generator 60. Next, the controller 80 checks if all power levels have been used. For example, in some embodiments, the device under test may be subjected to RF power signals having a range of frequencies, voltages and power levels. If there are other power levels or voltages that need to be applied, the controller 80 adjusts the signal generator 60 to the new power level, as shown in Box 440. After all of the power levels or voltages have been applied, the controller 80 checks if other frequencies should also be calibrated. If so, the controller 80 changes the frequency of the signal generator 60, and resets the power level, as shown in Box 450. This process continues until all settings are calibrated. Note that FIG. 4 assumes that there are two parameters (frequency and power level) that may be varied. However, the disclosure is not limited to this embodiment. For example, in certain embodiments, only one parameter is varied. In this case, Box 450 may be omitted. In other embodiments, three or more parameters may be varied. In this case, there may be additional decision boxes. As an example, in one embodiment, the frequency of the signal provided by the signal generator 60 may be swept from 850 MHz to 950 MHz in steps of 5 MHz. For each of those frequencies, the power may be swept from −50 dBm to 5 dBm in steps of 1 dBm. Of course, these values are merely illustrative and others may be used.

In all embodiments, after all of the calibration data has been collected, the controller 80 may create a correlation between the output from the RF meter 50 and the output from the monitoring device 70. In one embodiment, this correlation may be a lookup table representing the values from the RF meter 50 and the corresponding readings from the monitoring device 70. In another embodiment, the controller 80 may utilize the data to generate a polynomial equation that uses the reading from the RF meter 50 as an input and generates the expected output from the monitoring device 70. Thus, in this embodiment, the controller 80 calculates the coefficients used by the polynomial equation. In certain embodiments, the controller 80 may generate one equation for each frequency; such that for that frequency, the equation provides the expected power or amplitude from the monitoring device 70 based on the measured result at the RF meter 50. Once this process has been completed, and the correlations have been created, the calibration process is complete. The correlations, which may be one or more equations or a lookup table, may be stored in the memory associated with the controller 80. In another embodiment, the correlations may be stored in a remote memory device. These correlations are to be used during the normal test process.

Thus, it is not necessary to determine the signal loss from the signal generator 60 to the RF meter 50 or to the monitoring device 70, since actual readings at the RF meter 50 are correlated to actual readings at the monitoring device 70.

Figure 5:
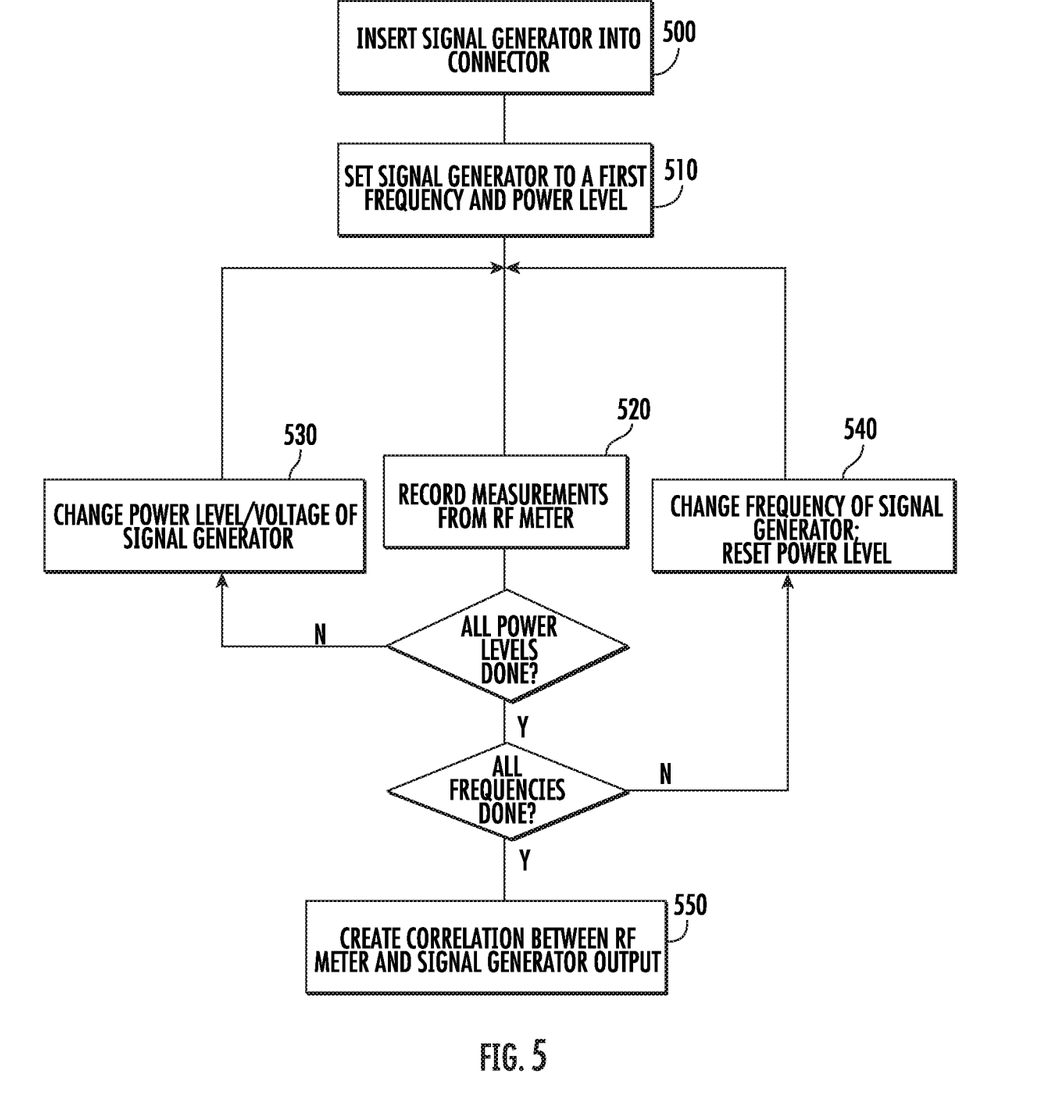
FIG. 5 shows the operation of the controller for the configuration shown in FIG. 3B.

FIG. 5 shows a flowchart that may be executed by the controller 80 to calibrate the production test system of FIG. 3A, where the device under test is to supply an output at one of its terminals. First, as shown in Box 700, the signal generator 60 is installed in the connector 20. As explained above, this physically disconnects the device under test from the first lead 21. Next, as shown in Box 510, the signal generator 60 is set to a first set of parameters. In one embodiment, the set of parameters includes frequency and power level. In some embodiments, different parameters may be used, such as frequency and amplitude. Next, as shown in Box 520, the signal received at the RF meter 50 is recorded and stored. The controller 80 associates the output from the signal generator 60 with the output from the RF meter 50. Next, the controller 80 checks if all power levels have been used. For example, in some embodiments, the device under test may be subjected to signals having a range of frequencies, voltages and power levels. If there are other power levels or voltages that need to be applied, the controller 80 adjusts the signal generator 60 to the new set of parameters, as shown in Box 530. After all of the power levels or voltages have been applied, the controller 80 checks if other frequencies should also be calibrated. If so, the controller 80 changes the frequency of the signal generator 60, and resets the power level, as shown in Box 540. This process continues until all settings are calibrated. Note that FIG. 5 assumes that there are two parameters (frequency and power level) that may be varied. However, the disclosure is not limited to this embodiment. For example, in certain embodiments, only one parameter is varied. In this case, Box 540 may be omitted. In other embodiments, three or more parameters may be varied. In this case, there may be additional decision boxes. As an example, in one embodiment, the frequency of the signal provided by the signal generator 60 may be swept from 850 MHz to 950 MHz in steps of 5 MHz. For each of those frequencies, the power may be swept from −50 dBm to 5 dBm in steps of 1 dBm. Of course, these values are merely illustrative and others may be used.

In all embodiments, after all of the calibration data has been collected, the controller 80 may create a correlation between the output from the RF meter 50 and the output from the signal generator 60. In one embodiment, this correlation may be a lookup table representing the values from the RF meter 50 and the corresponding outputs from the signal generator 60. In another embodiment, the controller 80 may utilize the data to generate a polynomial equation that uses the reading from the RF meter 50 as an input and generates the expected output from the signal generator 60. Thus, in this embodiment, the controller 80 calculates the coefficients used by the polynomial equation. In certain embodiments, the controller 80 may generate one equation for each frequency; since that for that frequency, the equation provides the expected power or amplitude from the signal generator 60 based on the measured result at the RF meter 50. Once this process has been completed, and the correlations have been created, the calibration process is complete. The correlations, which may be one or more equations or a lookup table, may be stored in the memory associated with the controller 80. In another embodiment, the correlations may be stored in a remote memory device. These correlations are to be used during the normal test process.

Thus, as described above, in it not necessary to determine the signal loss from the signal generator 60 to the RF meter 50, since actual readings at the RF meter 50 are correlated to actual outputs from the signal generator 60.

Figure 6:
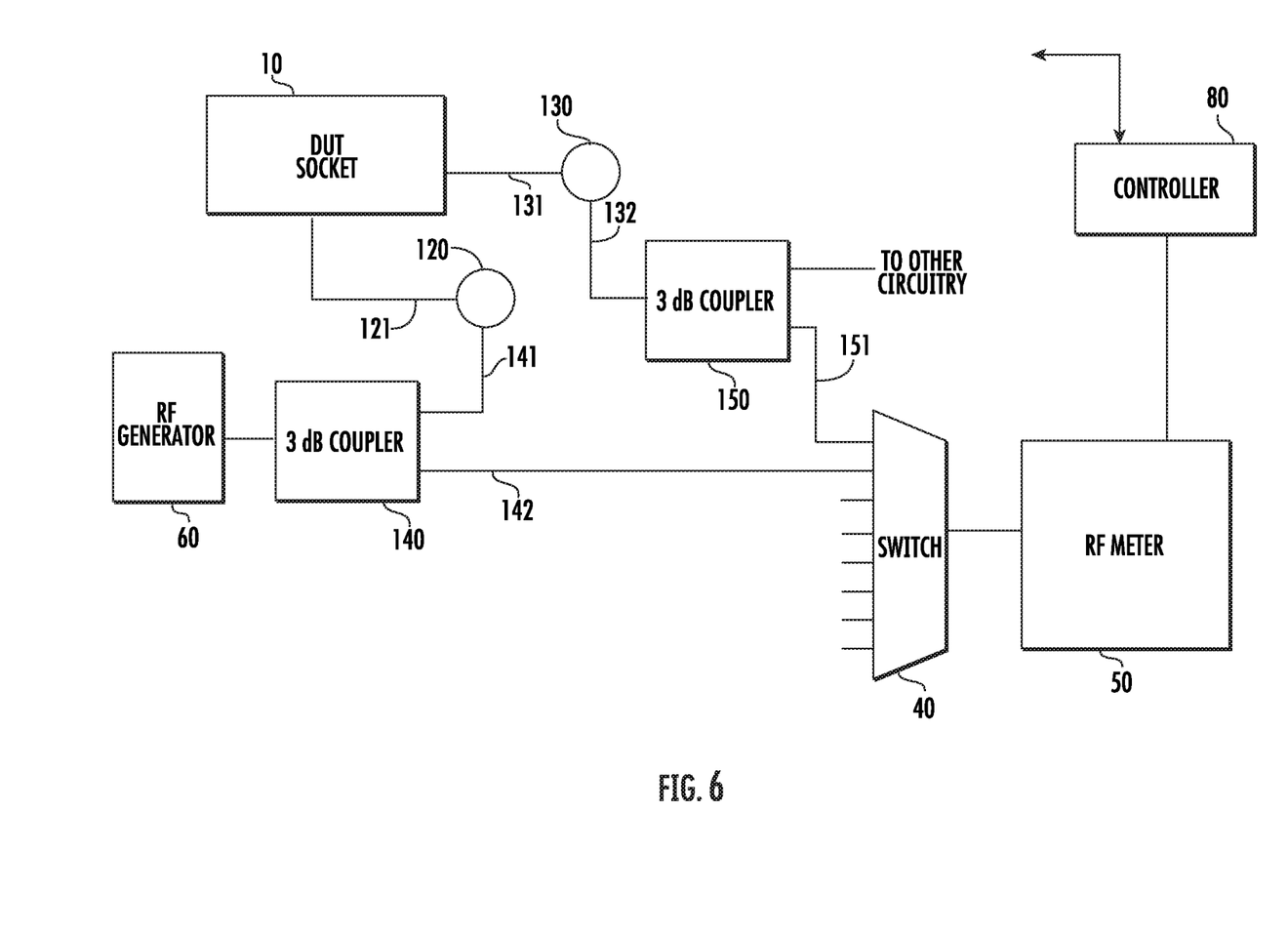
FIG. 6 shows a test production system for use with a two terminal device.

Once calibration is complete, the test process may begin. FIG. 6 shows a configuration for a device that has one input and one output. The device under test may be a power amplifier, for example. In this embodiment, there is a signal generator 60, a RF meter 50, a switch 40, a controller 80 and a socket 10 to hold the device under test. These components are as described above. Additionally, there is a first coupler 140. The input to the first coupler 140 is the output of the signal generator 60, the first output 141 from the first coupler 140 is in communication with the first lead of first connector 120 and a second output 142 from the first coupler 140 is in communication with the switch 40. The second lead 121 of the first connector 120 is in communication with an input on the device under test. A second connector 130 is also used. The second lead 131 of the second connector 130 is in communication with an output of the device under test. There is also a second coupler 150. The input to the second coupler 150 is the first lead 132 from the second connector 130, the first output 151 from the second coupler 150 is in communication with the switch 40 and the second output from the second coupler 150 may be used by other circuitry.

In operation, the controller 80 determines a set of parameters, such as frequency, amplitude, power and others, that the signal generator 60 will employ to generator the output signal. This output signal passes through the first coupler 140 to the first output 141, through the first connector 120 and is supplied to the input on the device under test. Additionally, the second output 142 from the first coupler 140 is supplied to the switch 40. In response to the input signal, the device under test outputs a signal, which passes through the second connector 130, through the second coupler 150 to the first output 151 and to the switch 40.

After configuring the signal generator 60, the controller 80 may configure the switch 40 such that the second output 142 from the first coupler 140 is available to the RF meter

50. The RF meter 50 then takes this measurement and the result is forwarded to the controller 80. The controller 80 then uses the correlation that was determined earlier (see FIG. 4) to estimate the power or amplitude that is being presented to the device under test. The controller 80 then configured the switch 40 so that the first output 151 from the second coupler 150 is available to the RF meter 50. The RF meter 50 then takes this measurement and the result is forwarded to the controller 80. The controller 80 then uses the correlation that was determined earlier (see FIG. 5) to estimate the power or amplitude that is being provided by the device under test. Based on these correlations, the controller 80 can then determine the gain of the power amplifier. In another embodiment, the switch 40 may not be present. Rather, there may be two separate RF meters; one to measure the signal from the second output 142 from the first coupler 140; and the second RF meter to measure the signal from the first output 151 from the second coupler 150.

The present system and method has many advantages. First, by creating a correlation between the readings of the RF meter 50 and the actual inputs and outputs from the device under test, production testing may be performed much more quickly. This reduces the heat that is generated by the device under test while disposed in the socket 10. Second, as described above, it is not necessary to accurately measure the losses in the signal path. Traditionally, a lot of effort has to be made to measure the signal loss from the signal generator 60 to the point of incidence on the device under test. The same thing has to be done for the signal loss from the device under test to any measurement system. With this system and method, the calibration process removes the need to quantity all of the signal attenuation.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of testing a semiconductor device using a production test system, wherein the production test system includes a socket to hold the semiconductor device, a signal generator and a RF meter; the method comprising:
   inserting a monitoring device in a connector, the connector in electrical communication with an interface on the socket for holding the semiconductor device;
   calibrating the RF meter and the monitoring device;
   removing the monitoring device;
   using the signal generator to create a signal wherein the signal is received at the semiconductor device and at the RF meter; and
   determining parameters of the signal as received by the semiconductor device based on measurements from the RF meter and correlation information determined during the calibrating.

2. The method of claim 1, wherein calibrating the RF meter and the monitoring device comprises:
   supplying a test signal with a known set of parameters from the signal generator, wherein the test signal is received by the RF meter and the monitoring device;
   recording a measurement of the test signal from the RF meter and the monitoring device;
   repeating the supplying and recording for a plurality of parameters to create calibration data; and
   using the calibration data to create a correlation between the measurement from the RF meter and the measurement from the monitoring device.

3. The method of claim 2, wherein the correlation comprises a polynomial equation.

4. The method of claim 2, wherein the correlation comprises a look up table.

5. The method of claim 2, wherein the parameters comprise frequency and power level; and wherein the repeating the supplying comprises setting the signal generator at a first frequency and using the signal generator to output the test signal using the first frequency and a plurality of different power levels; and changing the frequency to a second frequency and using the signal generator to output the test signal using the second frequency and the plurality of different power levels.

6. The method of claim 1, wherein the parameters comprise frequency and power level.

7. A production test system, comprising:
   a signal generator;
   a RF meter;
   a socket to hold a device under test;
   a controller, in communication with the signal generator and the RF meter; and
   a printed circuit board comprising:
   a coupler having an input and a first output and a second output; and
   a connector, wherein the connector has a first state wherein a first lead of the connector is in electrical communication with a second lead of the connector; and a second mode where a cable is attached to the connector and the first lead is not in communication with the second lead, wherein the second lead is in electrical communication with an interface on the socket;
   wherein the signal generator is in electrical communication with the input to the coupler, the first output from the coupler is in electrical communication with the first lead of the connector, and the second first is in communication with the RF meter.

8. The production test system of claim 7, wherein the printed circuit board comprises a switch, having a plurality of inputs and one output in communication with the RF meter, wherein the second output of the coupler is one of the plurality of inputs, and wherein the controller controls the switch to select one of the plurality of inputs to be in electrical communication with the RF meter.

9. The production test system of claim 7, wherein in calibration mode, a monitoring device is inserted in the connector, the controller is in communication with the monitoring device, and wherein the controller:
   sets the signal generator at a first frequency and uses the signal generator to output a test signal using the first frequency and a plurality of different power levels;
   records the test signal at the monitoring device and at the RF meter; and correlates measurements at the monitoring device with measurements at the RF meter at the plurality of different power levels to create a correlation.

10. The production test system of claim 9, wherein the correlation comprises a polynomial equation.

11. The production test system of claim 9, wherein the correlation comprises a look up table.

12. The production test system of claim 9, wherein during test mode, the controller:
uses the signal generator to create a signal wherein the signal is received at a semiconductor device disposed in the socket and at the RF meter; and
determines a power level of the signal as received by the semiconductor device based on measurements from the RF meter and the correlation determined during the calibration mode.

* * * * *